(12) United States Patent
Matzke et al.

(10) Patent No.: US 6,599,436 B1
(45) Date of Patent: Jul. 29, 2003

(54) FORMATION OF INTERCONNECTIONS TO MICROFLUIDIC DEVICES

(75) Inventors: Carolyn M. Matzke, Los Lunas, NM (US); Carol I. H. Ashby, Edgewood, NM (US); Leonardo Griego, Tijeras, NM (US)

(73) Assignee: Sandia Corporation, Albuquerque, NM (US)

( * ) Notice: Subject to any disclaimer, the term of this patent is extended or adjusted under 35 U.S.C. 154(b) by 102 days.

(21) Appl. No.: 10/016,956

(22) Filed: Dec. 6, 2001

(51) Int. Cl.[7] .................. H01L 21/00; B44C 1/22; C03C 15/00
(52) U.S. Cl. .............. 216/24; 216/2; 216/27; 216/33; 216/41; 438/745; 438/753; 346/140.1; 385/83
(58) Field of Search .................. 216/2, 24, 27, 216/33, 41, 97, 99, 100; 438/745, 753, 754, 756; 346/140.1; 385/83

(56) References Cited

U.S. PATENT DOCUMENTS

| 5,501,893 A | 3/1996 | Laermer ............... 428/161 |
| 5,989,445 A | * 11/1999 | Wise et al. ............ 438/753 X |
| 6,096,656 A | 8/2000 | Matzke ................. 438/702 |

* cited by examiner

*Primary Examiner*—William A. Powell
(74) *Attorney, Agent, or Firm*—John P. Hohimer

(57) ABSTRACT

A method is disclosed to form external interconnections to a microfluidic device for coupling of a fluid or light or both into a microchannel of the device. This method can be used to form optical or fluidic interconnections to microchannels previously formed on a substrate, or to form both the interconnections and microchannels during the same process steps. The optical and fluidic interconnections are formed parallel to the plane of the substrate, and are fluid tight.

38 Claims, 5 Drawing Sheets

Section 1 - 1

Section 2 - 2

FORMATION OF INTERCONNECTIONS TO MICROFLUIDIC DEVICES

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to microfluidic devices having one or more microchannels formed on a substrate, and specifically to optical or fluid interconnections formed to microfluidic devices, to microfluidic devices incorporating such interconnections, and to a process for forming the same.

BACKGROUND OF THE INVENTION

Microfluidic devices are being developed for many applications including micro analysis systems, micromechanical actuators, localized or global substrate cooling, and ink-jet printing. Micro analysis systems which utilize microminiature fluid channels include liquid and gas chromatography, electrophoresis, free-flow fractionation, and polmerase chain reaction.

Conventional methods for forming interconnections to microfluidic devices are largely based on piece-part assembly with microcapillary tubing being oriented perpendicular to a backside of a substrate containing the microfluidic device and connected to a microchannel through a hole formed through the substrate (see e.g. U.S. Pat. No. 6,096,656 to Matzke et al, which is incorporated herein by reference). The microcapillary tubing is attached to the substrate using an adhesive which is disposed in the hole through the substrate. In some cases, the microcapillary tubing can be initially attached to small pieces of glass having machined thru-holes which are then attached to the backside of the substrate using an adhesive or anodic bonding.

The present invention provides an improvement over the prior art by forming external interconnections using microcapillary tubing or optical fibers which are oriented substantially parallel to an upper surface of the substrate whereon the microfluidic device is formed.

The present invention allows the external interconnections to be precisely aligned with one or more microchannels within a microfluidic device, and to be formed during or after formation of the microchannels using processes which are compatible with formation of the microchannels.

These and other advantages of the present invention will become evident to those skilled in the art.

SUMMARY OF THE INVENTION

The present invention relates to a microfluidic device comprising a substrate having at least one microchannel formed therein, with at least one external interconnection to the microchannel being formed substantially parallel to a surface of the substrate by a microcapillary tubing or an optical fiber located within an elongate trench formed in the substrate proximate to the microchannel and connected thereto, and with a covering layer comprising silicon oxynitride being deposited over the substrate to cover the trench and thereby adhere, at least in part, the microcapillary tubing or optical fiber to the substrate. The microcapillary tubing or optical fiber is generally further adhered to the substrate by an adhesive disposed within the trench. The covering layer also forms a fluid-tight seal between the microchannel and the external interconnection which is sealed at its sides and bottom to the trench with the adhesive.

The trench can be formed with sidewalls that are oriented substantially perpendicular to the surface of the substrate, or at oblique angles to the surface. One end of the trench proximate to the microchannel can be optionally graded to accommodate microcapillary tubing which is larger than the microchannel.

A barrier layer (e.g. comprising silicon dioxide) can be provided on one or both sides of the silicon oxynitride layer for improved resistance to moisture or chemical attack.

The substrate can comprise a material such as a semiconductor (e.g. silicon), crystalline quartz, fused silica, glass, ceramic, a polymer or a metal. In some instances an electrically-insulating substrate is preferred, for example, when high voltages are provided to the microfluidic device to provide an electrophoretic, electrokinetic or electroosmotic flow therein.

The present invention further relates to an optical or fluidic interconnection to a microchannel formed in a substrate. The interconnection comprises an elongate trench formed in the substrate proximate to the microchannel and connected thereto, with the trench being aligned substantially parallel to a surface of the substrate wherein the microchannel is formed. The interconnection further comprises a microfluidic tubing or optical fiber located within the trench and adhered to the sides and bottom of the trench with an adhesive disposed in the trench, and a fluid-tight covering formed over at least a portion of the trench, with the fluid-tight covering comprising a layer of silicon oxynitride.

The interconnection can be formed to microfluidic devices fabricated on many different types of substrates as described above; and the trench can be formed with sidewalls that are substantially perpendicular to the surface of the substrate, or oriented at oblique angles thereto. The trench can also be graded at one end thereof proximate to the microchannel, if needed.

A barrier layer can be provided on one or both sides of the silicon oxynitride layer to improve the resistance to moisture and prevent chemical attack (e.g. corrosion). The barrier layer, if used, generally comprises silicon dioxide.

The present invention also relates to a method for forming an interconnection to a microchannel on a substrate that comprises forming (e.g. by etching) an elongate trench below a surface of the substrate near an edge thereof proximate to the microchannel, with the trench being sized to receive one end of a microcapillary tubing or an optical fiber, and with one end of the trench being connected to the microchannel; adhering the end of the microcapillary tubing or optical fiber within the trench with an adhesive (e.g. an epoxy which can be cured using ultraviolet light); depositing a sacrificial material (e.g. a photoresist or a photodefinable polymer) within a portion of the trench not occupied by the microcapillary tubing or optical fiber; depositing a layer of silicon oxynitride over the surface of the substrate, with the layer of silicon oxynitride forming a fluid-tight covering over the trench and over the end of the microcapillary tubing or optical fiber located within the trench; and removing (e.g. by dissolution using a solvent) the sacrificial material from the trench. This method is particularly useful for forming interconnections to microfluidic devices when the microchannel is pre-existing on the substrate. An optional step can be provided for forming a barrier layer on one or both sides of the silicon oxynitride layer, if needed, to improve resistance to moisture and chemical attack.

In some instances, the present invention can be used to form the interconnections and microchannels at the same time and using the same series of process steps. This can be done with a simple modification of the above method by forming a microchannel on the substrate, and forming at least one elongate trench connected to the microchannel, with each trench being located near an edge of the substrate and being sized to receive one end of a microcapillary tubing or optical fiber; adhering the end of the microcapillary tubing or optical fiber within the trench with an adhesive; depositing a sacrificial material within the microchannel and within a portion of the trench not occupied by the microcapillary tubing or optical fiber; depositing a layer of silicon oxynitride over the surface of the substrate, with the layer of silicon oxynitride forming a fluid-tight covering over the microchannel and the trench, and over the end of the microcapillary tubing or optical fiber located within the trench; and removing the sacrificial material from the microchannel and trench.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
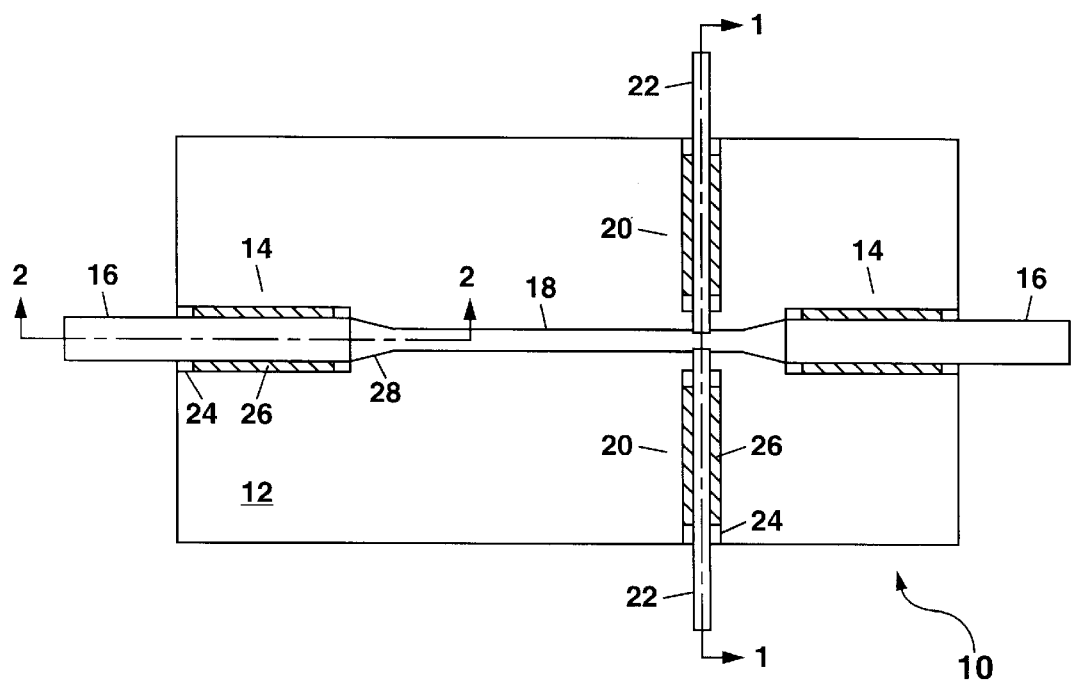
FIG. 1 schematically illustrates in plan view a microfluidic device having a plurality of optical and fluidic interconnections formed according to the present invention.

Referring to FIG. 1, there is shown a schematic plan view of an example of a microfluidic device 10 formed on a substrate 12 according to the present invention. The microfluidic device 10 includes a plurality of interconnections including fluidic interconnections 14 between microcapillary tubing 16 (also termed macrotubing, microtubing or capillary tubing) and a microchannel 18, and optical interconnections 20 between an optical fiber 22 and the microchannel 18. The fluidic interconnections 14 are useful, for example, to couple a fluid into and out from the microchannel 18; and the optical interconnections 20 are useful to couple light into and out from the microchannel 18, for example, to perform an optical analysis (e.g. by absorption, fluorescence or light scattering) of the fluid within the microchannel 18.

As defined herein, the term "microchannel" refers to a hollow fluid duct having a width that is generally in the range from about 5 to 500 microns ($\mu$m), and a height that is generally in the same range as the width. The term "fluid" is intended to include both liquids and gases.

Figure 2A:
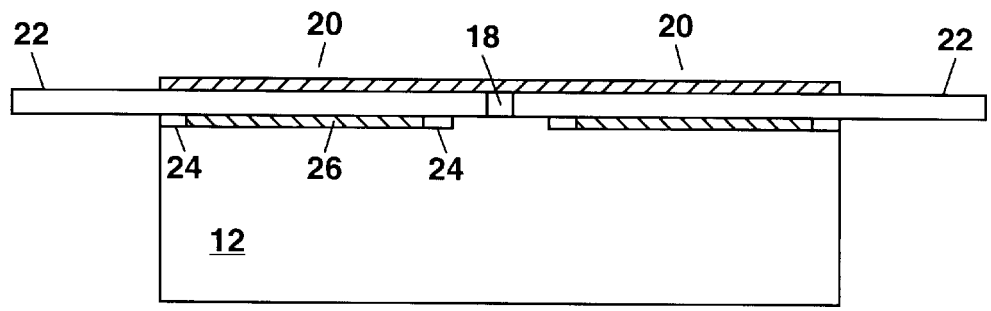
FIGS. 2A and 2B show schematic cross-section views of the device of FIG. 1 along the section lines 1—1 and 2—2, respectively.
Figure 2B:
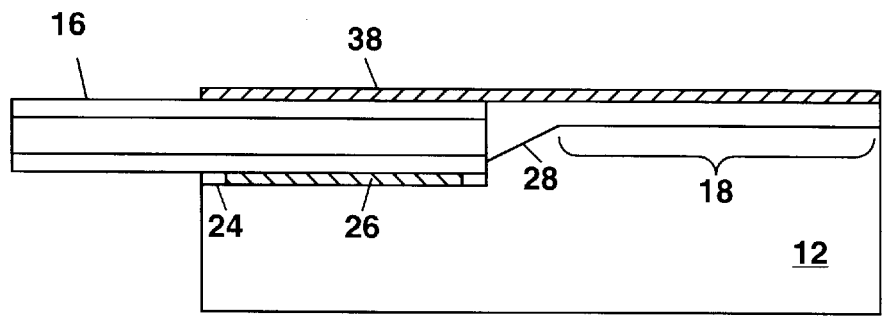

FIGS. 2A and 2B show enlarged schematic cross-section views along the section lines 1—1 and 2—2 in FIG. 1, respectively. Each interconnection 14 and 20 in FIGS. 2A and 2B can be formed by etching an elongate trench 24 below an upper surface of the substrate 12, with each trench 24 being sized to accept the microcapillary tubing 16 or optical fiber 22, and with each trench 24 further being connected to an end or side of the microchannel 18. Each trench 24 is preferably sized so that a majority or the entirety of the tubing 16 or fiber 22 is located below the surface of the substrate 12. This aids in photolithography during formation of the external interconnections to the microfluidic device 10 and during the fabrication of other elements on the substrate 12 by maintaining a substantially planar topography for the substrate 12.

A portion of the trench 24 can be graded (e.g. tapered or stepped) in depth and/or width, if needed, to optimize coupling between the microchannel 18 and the microcapillary tubing 16 or optical fiber 22. Lateral and vertical grading of the end of the trench 24 between the microchannel 18 and the microcapillary tubing 16 is shown in FIGS. 1 and 2B. Alternately, the microchannel 18 itself can be locally graded in depth or width for coupling to the interconnections 14 and 20. In the example of FIG. 1, a localized vertical tapering of the microchannel 18 can be provided near the ends of the optical fiber 22 terminating at each side or slightly within the microchannel 18. This is useful, for example, for coupling light from an optical fiber 22 into and out from the microchannel 18 when an outer diameter of the fiber 22 exceeds the depth of a majority of the microchannel 18. The microcapillary tubing 16 and optical fiber 22 can each have an outer diameter of, for example, 125–150 $\mu$m or more.

Formation of the interconnections 14 and 22 will now be described with reference to FIGS. 3A–3I which show various stages of fabrication of the fluidic interconnection 14 along the section line 2—2 in FIG. 2B. Those skilled in the art will understand that the optical interconnection 20 can be formed using the same series of process steps used to form the fluidic interconnection 14. Generally, both types of interconnections 14 and 20 will be fabricated at the same time.

FIGS. 3A–3I show a series of steps that can be used to fabricate the interconnections 14 and 20 of FIG. 1 when one or more microchannels 18 are to be formed at the same time on the substrate 12 using the same processing steps used to form the interconnections 14 and 20. Those skilled in the art will understand that the teachings of the present invention can also be adapted to form one or more interconnections 14 or 20 on a substrate 12 which already has one or more microchannels 18 formed thereon. Only the essential process steps will be described in detail herein with reference to FIGS. 3A–3I.

Figure 3A:
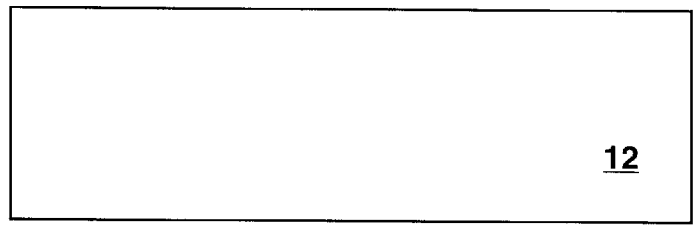
FIGS. 3A–3I illustrate a series of process steps that can be used to form the interconnections of FIG. 1.

In FIG. 3A, a substrate 12 is provided which comprises either a crystalline or a non-crystalline material. In particular, crystalline materials that can be used for the substrate 12 include semiconductors (e.g. silicon, germanium, gallium arsenide) and crystalline quartz. Non-crystalline materials that can be used as the substrate 12 can include glasses, polymers (i.e. plastics), ceramics, metals (including metal alloys), and fused silica. The exact type of substrate 12 to be used according to the present invention will depend upon whether the substrate 12 is to be electrically insulating or electrically conducting. An electrically-insulating substrate 12 comprised of, for example, an undoped semiconductor, glass, ceramic, fused silica, crystalline quartz, or a polymer is preferred for applications requiring high voltages (e.g. 20–100 volts or more) to electrodes located within the microchannel 18 for electrophoresis or electroosmosis. Alternately, a doped semiconductor or metal substrate 12 can be used when high voltages are not present on the substrate 12.

Figure 3B:
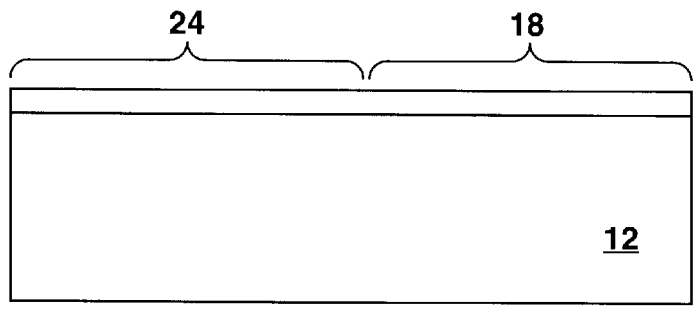
Figure 3C:
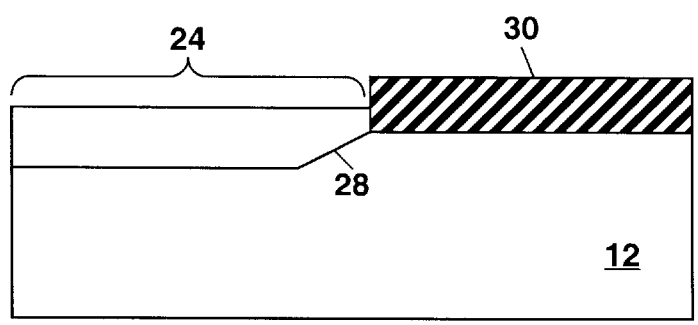
Figure 3D:
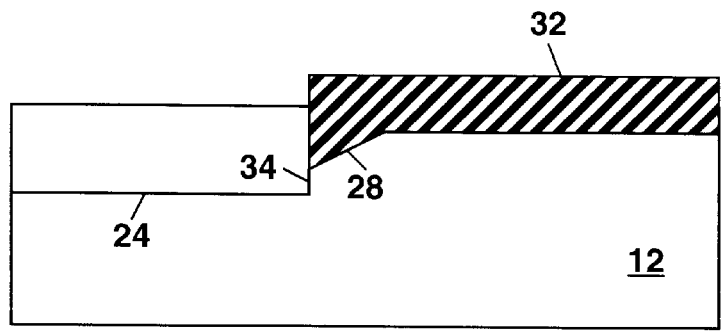

In FIGS. 3B–3D, the substrate 12 is patterned to form the microchannel 18 and the trench 24 which includes a graded portion 28. When the microchannel 18 and trench 24 are formed by photolithography and etching, the term "patterning" as used herein refers to a series of processing steps including applying a photoresist to the substrate 12, prebaking the photoresist, aligning the substrate 12 with a photomask, exposing the photoresist through the photomask, developing the photoresist, baking the photoresist to define an etch mask having an opening therethrough that has the lateral shape of the microchannel 18 and trench 24 to be formed in the substrate 12, etching away the surface of the substrate 12 not protected by the photoresist, and stripping the protected areas of the photoresist so that further processing can take place. These processing steps are well-known in the art and need not be described herein in detail. To fabricate the microchannel 18 and trench 24 with different depths as shown in FIGS. 3B–3D, multiple etch masks are generally required.

In FIG. 3B, one or more etching steps can be used to etch downward through the substrate 12 to the depth of the microchannel 18 using a patterned etch mask (not shown) which is formed over the substrate 12. This etching can be performed either using a wet etchant or a dry etching process (e.g. reactive ion etching). An anisotropic wet etchant can be used to provide sidewall and bottom surfaces for the microchannel 18 and trench 24 that are defined by crystalline planes in the case of a crystalline substrate material. Suitable anisotropic wet etchants that can be used for practice of the present invention for a silicon substrate 12 include potassium hydroxide (KOH), tetramethyl ammonium hydroxide (TMAH) or ethylenediamine pyrocatechol (EDP). For a crystalline quartz substrate 12, hydrofluoric acid (HF) can be used.

When forming the microchannel 18 and trench 24 using an anisotropic wet etchant, the sidewalls of a crystalline substrate 12 will generally be oblique with respect to the surface of the substrate 12 with the exact angle of the sidewalls depending upon the crystalline orientation of the substrate 12. For example, the use of KOH, TMAH or EDP to form the microchannel 18 and trench 24 in a (100) silicon substrate will result in sidewalls that are angled by 55° with respect to the surface of the silicon substrate 12 since the etching will terminate upon reaching {111} planes of silicon. To form the microchannel 18 and trench 24 with substantially vertical sidewalls (i.e. perpendicular to the surface of the substrate 12), an anisotropic dry etching process such as reactive ion etching can be used. Such a dry etching process is disclosed, for example, in U.S. Pat. No. 5,501,893 to Laermer, which is incorporated herein by reference.

In FIG. 3C, when it is necessary to etch the trench 24 deeper than the microchannel 18, an etch mask 30 (e.g. comprising photoresist) can be provided over the substrate 12 to fill and protect the microchannel 18 in preparation for further etching of the trench 24. One or more further etching steps as described above can then be used to complete formation of the trench 24. A portion 28 of the trench 24 can be formed with a vertically tapered bottom surface as shown in FIG. 3C by using an anisotropic wet etching step (e.g. KOH, TMAH or EDP for a silicon substrate 12 with the bottom surface being defined by a {111} plane of silicon). Alternately, the bottom surface of the trench can be stepped in height near the microchannel 18 by a series of masking and anisotropic dry etching steps.

In FIG. 3D, the mask 30 can be extended to cover the graded region 28 or it can be replaced by another etch mask 32 in preparation for one or more final etching steps to complete formation of the trench 24 in the example of FIG. 1. The final etching step(s) can also produce a vertical end wall 34 of the trench 24 which is useful as a stop to precisely align the microcapillary tubing 16 or optical fiber 22 in the trench 24.

Figure 3E:
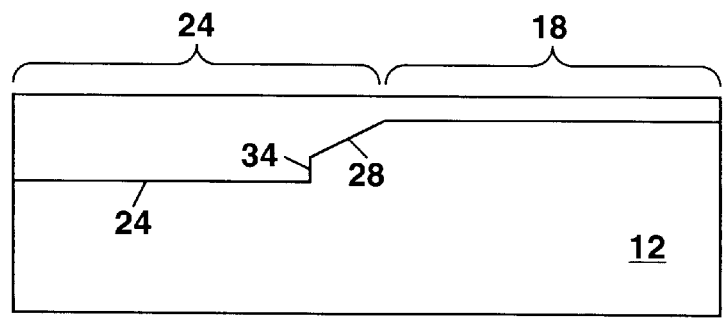

The substrate 12 with the completed microchannel 18 and trench 24 is shown in FIG. 3E after stripping of the etch mask. The completed microchannel 18 and trench 24 can be optionally lined with a layer (not shown) of silicon oxynitride which can be advantageous for certain applications such as chromatography or electrophoresis. This can be done by depositing a 0.05- to 3-$\mu$m-thick layer of silicon oxynitride over the substrate 12 and in the microchannel 18 and trench 24 using a high-density plasma deposition process as described hereinafter.

Those skilled in the art will understand that the microchannel 18 and trench 24 can be formed by other processes depending upon the composition of the substrate 12 and the dimensions and dimensional tolerance required for the microchannel 18 and trench 24. These other processes can include isotropic etching, mechanical abrasion, ion milling or laser ablation. Additionally, the microchannel 18 and trench 24 can be replicated by pressing a master into the substrate 12. This replication process is particularly useful when the substrate comprises a moldable material such as a ceramic in the green (i.e. unfired) state, a glass or polymer heated above a softening temperature, or a metal at room temperature or at an elevated temperature. The term "replication" as used herein is intended to include any type of molding operation including injection molding, stamping, embossing or casting with or without heating. In some instances, one or more microchannels 18 will have already been formed on the substrate 12 so that only the interconnections 14 and 20 need be formed on the substrate 12. In this case, the process used for forming the trench 24 can be selected for compatibility with the already existing microchannels 18.

Figure 3F:
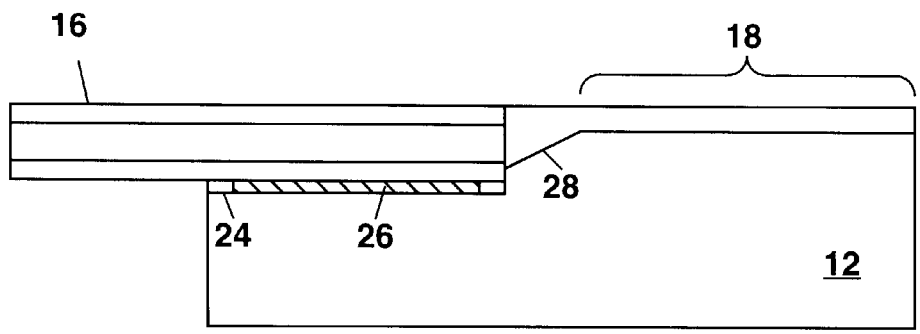

In FIG. 3F, the microcapillary tubing 16 is attached to the substrate 12 in the trench 24 using an adhesive 26 that is preferably disposed in the trench 24 prior to insertion of the microcapillary tubing 16. The adhesive 26 can be, for example, an epoxy that is curable using ultraviolet (UV) light. Alternately, the adhesive 26 can be a polymer (e.g. silicone rubber) which is impervious to a fluid to be provided to the microchannel 18 and also to a solvent (e.g. acetone) that is used during a later step in forming the interconnections 14 and 20. The adhesive 26 can be disposed in a central portion of each trench 24 prior to insertion of the microcapillary tubing 16 or optical fiber 22, and preferably does not obscure the bore 30 of the tubing 16 or the end of the optical fiber 22. Any of the adhesive 26 that extends above the upper surface of the substrate 12 is preferably removed either before or after curing of the adhesive 26 to maintain a planar topography for the substrate 12.

Figure 3G:
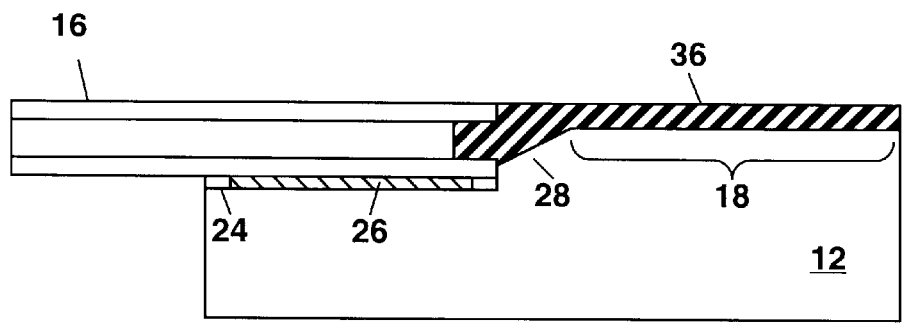

In FIG. 3G, once the microcapillary tubing 16 and optical fibers 22 are in place on the substrate 12, one or more layers of a sacrificial material 36 (e.g. photoresist such as a positive tone thick photoresist, or a photodefinable polymer such as a photodefinable polyimide) can be spun on over the substrate 12 to fill in the microchannel 18 and the graded portion 28, with the sacrificial material 36 then being removed from the remainder of the substrate 12. This step of removing any excess sacrificial material can be performed using photolithographic patterning, developing. and stripping as known to the art.

Additionally, an oxygen plasma cleansing step can be used to remove any photoresist residue remaining on the upper surface of the substrate 12, and on the microcapillary tubing 16 and optical fibers 22. The sacrificial material 36 can, however, extend partway (e.g. by a few microns) over the top of the microcapillary tubing 16 and optical fiber 22 near the graded portion 28 to ensure that the ends of the tubing 16 and fibers 22 are covered. Removing the sacrificial material 36 from the majority of the surfaces of the microcapillary tubing 16 and optical fiber 22 is important since these surfaces will be sealed using a deposited fluid-tight covering 38 as described hereinafter. If the sacrificial material 36 extends partway into the bore 40 of the microcapillary tubing 16 as shown in FIG. 3G, this is not problematic since the sacrificial material 36 will later be removed using a solvent.

Figure 3H:
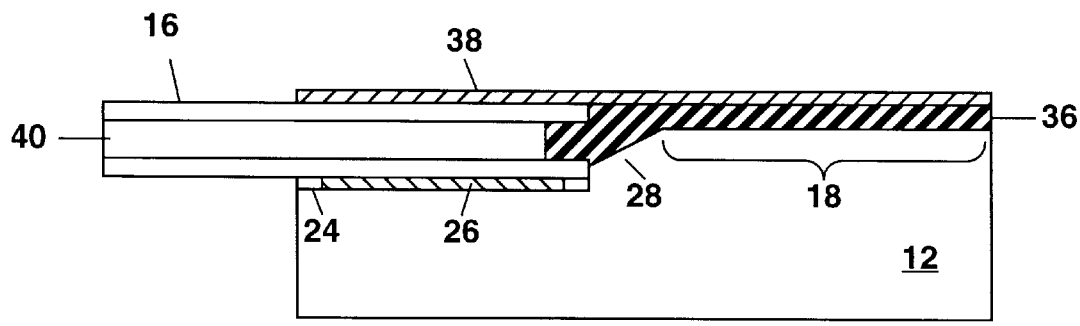

In FIG. 3H, a fluid-tight covering layer 38 is blanket deposited over the substrate 12 to close the microchannels 18 and the trench 24 and to form a fluid-tight seal between the microchannels 18 and the microcapillary tubing 16 and optical fibers 22. The covering layer 38 comprises silicon oxynitride that can be deposited by a high-density plasma deposition process as disclosed in U.S. Pat. No. 6,096,656 to Matzke et al, which is incorporated herein by reference. This high-density plasma deposition process utilizes a plasma having a relatively high electron, ion and neutral radical density and flux (e.g. an electron density of $10^{11-5 \times 10^{13}}$ electrons/cm$^3$ and a positive ion flux of 1–50 mA/cm$^2$). Such a plasma can be obtained, for example, with an electron-cyclotron resonance (ECR) plasma deposition system, or with an inductively-coupled plasma (ICP) deposition system.

The ECR plasma deposition system, which is used to deposit the covering layer 38 according to the present invention, utilizes microwaves to generate a high-density plasma from supplied source gases, and a magnetic field to keep electrons circulating in the plasma to produce a high electron density and to control beam collimation. No additional substrate heating is necessary for the ECR plasma deposition system so that deposition of the covering layer 38 can be performed at a low temperature of about 100° C. or less. The use of a relatively low deposition temperature is advantageous since this allows the use of photoresist or a photodefinable polymer as the sacrificial material 36 while minimizing potential damage to the sacrificial material 36 by polymerization.

Additionally, the ECR plasma deposition system allows the use of a low substrate bias voltage of 100 volts or less. The bias voltage need not be constant during the entire deposition of the covering layer 38. For example, a bias voltage in the range of 50–100 volts can be used for a short duration (e.g. 15 seconds) upon commencing deposition of the covering layer 38 to improve adhesion of the covering layer 38 to the substrate 12, to the microcapillary tubing 16 and optical fibers 22, and to any microchannels 18 pre-existing upon the substrate 12. The bias voltage can be reduced to a low value (e.g. 5 volts) to prevent etch-back during deposition of the remainder of the covering layer 38, or alternately, the bias voltage can be maintained in the range of 20–100 volts during deposition of part or all of the covering layer 38 to densify the covering layer 38.

Alternately, the covering layer 38 can be deposited using an inductively-coupled plasma deposition system as known to the art. An inductively-coupled plasma deposition system utilizes a radio-frequency (rf) coil to produce a plasma having characteristics similar to the ECR system described above. Inductively-coupled plasma deposition systems are also referred to as transformer-coupled plasma (TCP) systems or as rf induction (RFI) systems.

The covering layer 38 in FIG. 3H can comprise a single layer of silicon oxynitride, or alternatively a layer of silicon oxynitride with a layer of silicon dioxide deposited on one or both sides of the silicon oxynitride layer. The use of silicon oxynitride for the covering layer 38 is advantageous since this material is resistant to cracking, and is resilient. The provision of a silicon dioxide layer on one or both sides of the silicon oxynitride layer is useful as a barrier layer since the silicon oxynitride can be attacked by moisture and other chemicals (e.g. aqueous, ethanolic or methanolic fluids) present within the microchannel 18, or in the environment.

To form the covering layer 38 using an ECR plasma deposition system, the ECR system can be operated at a microwave power level of generally 80–400 W, and preferably at either 125 or 385 W, with the microwave frequency generally being 2.45 GHz. The silicon oxynitride and silicon dioxide layers can be deposited during a single run without turning off the plasma. This can be done by switching between different source gases including silane (SiH$_4$) and oxygen- and nitrogen-containing gases such as nitrogen (N$_2$), oxygen (O$_2$) and nitrous oxide (N$_2$O). Argon (Ar) can additionally be added to the plasma.

The ECR high-density plasma can be operated at a pressure of typically 15–30 mTorr, and preferably about 20 mTorr. Flow rates for the source gases can be in the range of 5–50 standard-cubic-centimeters-per-minute (sccm) silane, 5–50 sccm of the oxygen- and nitrogen-containing source gases, and 0–20 sccm argon. The nitrogen-containing source gas can be switched off to deposit each silicon dioxide layer, and switched on again to deposit the silicon oxynitride layer. Deposition of the covering layer 38 an be performed as previously described with a bias voltage provided to the substrate 12, and with no substrate heating. The deposition rate of the silicon dioxide and silicon oxynitride layers can be in the range of 5–400 nanometers/ minute using an ECR plasma.

When the covering layer comprises silicon oxynitride alone, the thickness of the silicon oxynitride can be, for example, about 2–5 $\mu$m or more, with a thickness of about 5 $\mu$m generally being used when the size of the trench 24 is about 250 $\mu$m. When the silicon oxynitride layer is sandwiched between a pair of silicon dioxide layers, the silicon oxynitride layer can be, for example, 1.2 $\mu$m thick, with each silicon dioxide layer being 0.4 $\mu$m thick for use with microcapillary tubing 16 and optical fibers 22 each having an outer diameter in the range of 125–150 $\mu$m.

The ECR-deposited silicon oxynitride can comprise, for example, 40 at. % silicon, 36 at. % nitrogen, 12 at. % oxygen and 12 at. % hydrogen. In general, the silicon oxynitride deposited to form the covering layer 38 according to the present invention can comprise a partially hydrogenated silicon oxynitride having a composition $Si_wO_xN_yH_z$, with w being in the range 25–65 at. % silicon, x being in the range 5–40 at. % oxygen, y being in the range 10–40 at. % nitrogen, and z being in the range 0–25 at. % hydrogen. The exact composition of the silicon oxynitride will depend upon the operating parameters of the high-density plasma deposition system, and on whether or not an annealing step is provided to densify the silicon oxynitride thereby lowering its hydrogen content.

In forming the covering layer 38 comprising silicon oxynitride with or without added silicon dioxide barrier layers using an ICP plasma source, the same source gases above can be used, and the flow rates and plasma parameters can be adjusted to provide a composition for the silicon oxynitride within the above range as determined from Rutherford backscattering measurements and/or index of refraction measurements. As described above, the silicon oxynitride and silicon dioxide layers are preferably deposited without switching off the plasma to obtain the highest quality covering layer 38, and to prevent any potential cracking of the silicon dioxide layers therein.

Figure 3I:
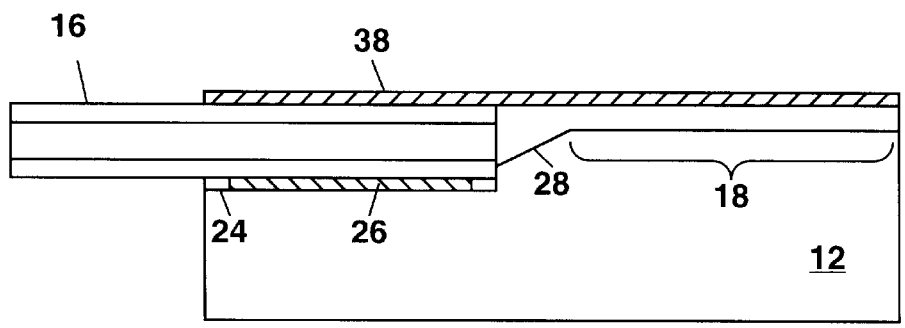

In FIG. 3I, the sacrificial material 36 is removed from the microchannel 18 and trench 24 to complete formation of the microchannel 18 and the interconnections 14 and 20. The covering layer 38 provides a fluid-tight seal between the microcapillary tubing 16 and optical fibers 22 and the microchannel 18, and also further adheres the tubing 16 and fibers 22 to the surrounding substrate 12.

The sacrificial material 36 in FIG. 3H can be removed by dissolution using a suitable solvent such as acetone, n-methyl pyrrolidone (NMP) or a commercial photoresist stripping solution. This can be done by contacting the sacrificial material 36 with the solvent provided through the microcapillary tubing 16, through an open end of the microchannel 18, or through a plurality of micron-sized holes (not shown) formed (e.g. using reactive ion etching or laser ablation) down through the covering layer 38 to expose the sacrificial material 36. Removal of the sacrificial material 36 using the solvent can be performed over a period of up to several hours or over night, with or without agitation or heating. Once the sacrificial material 36 has been removed, the covering layer 38 can be densified, if desired, by heating to a high temperature of 400° C. or more for about 30 seconds in a rapid thermal annealer.

When holes have been formed through the covering layer 38 to remove the sacrificial material 36, the holes can be plugged by depositing one or more additional material layers (not shown) over the substrate 12. These additional layers can comprise, for example, silicon oxynitride and/or silicon dioxide deposited using the ECR or ICP deposition system as described previously. Alternately, the additional layers can comprise an elastomer, a photoactivated epoxy, a commercial potting compound, a polyimide, a spin-on glass or a deposited metallization. These additional material layers can be useful to further strengthen the microchannel 18 and the interconnections 14 and 20, and can be used for this purpose even if no holes are formed through the covering layer 38.

The completed microfluidic device 10 having one or more fluidic interconnections 14 and/or optical interconnections 20 is as shown in FIGS. 1 and 2A and 2B. In other embodiments of the present invention where one or more external interconnections 14 and/or 20 are to be formed to one or more microchannels 18 already existing on a substrate 12, the existing microchannels 18 can be covered, if needed, with an etch mask or other protection layer during formation of the interconnections 14 and 20. In this case, the sacrificial material 36 in FIG. 3G will be largely confined to the graded region 28 or to a small (e.g. micron-sized) gap between the microcapillary tubing 16 or optical fiber 22 and the microchannel 18, and will be more easily removable using the process described previously.

Those skilled in the art will understand that microfluidic devices 10 with arbitrary microchannel shapes and cross sections, and with multiple intersecting microchannels 18 can be formed according to the present invention so that a fluid can be introduced into and out of the microchannels 18 using one or more fluidic interconnections 14 according to the present invention, and with optional coupling of light (e.g. from a laser, light-emitting diode, or a lamp) into and out from the microchannels 18 by one or more optical interconnections 20 for analysis of particular analytes in the fluid. Other applications and variations of the present invention will become evident to those skilled in the art. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A microfluidic device, comprising:
   (a) a substrate having at least one microchannel formed therein;
   (b) at least one external interconnection to the microchannel formed substantially parallel to a surface of the substrate by a microcapillary tubing or an optical fiber located within an elongate trench formed in the substrate proximate to the microchannel and connected thereto; and
   (c) a covering layer comprising silicon oxynitride deposited over the substrate to cover the trench and thereby adhere, at least in part, the microcapillary tubing or optical fiber to the substrate.

2. The device of claim 1 wherein the covering layer forms a fluid-tight seal between the microchannel and the external interconnection.

3. The device of claim 1 wherein the substrate comprises a material selected from the group consisting of semiconductors, crystalline quartz, fused silica, glasses, ceramics, polymers and metals.

4. The device of claim 3 wherein the substrate comprises silicon.

5. The device of claim 1 wherein the microcapillary tubing or optical fiber is further adhered to the substrate by an adhesive disposed within the trench.

6. The device of claim 1 wherein the trench comprises a pair of sidewalls which are substantially perpendicular to the surface of the substrate.

7. The device of claim 1 wherein the trench comprises a pair of sidewalls oriented at oblique angles to the surface of the substrate.

8. The device of claim 1 further including a barrier layer located on at least one side of the silicon oxynitride layer.

9. The device of claim 8 wherein the barrier layer comprises silicon dioxide.

10. The device of claim 1 wherein the trench is graded at an end thereof proximate to the microchannel.

11. An optical or fluidic interconnection to a microchannel formed in a substrate, comprising:
   (a) an elongate trench formed in the substrate proximate to the microchannel and connected thereto, with the trench being aligned substantially parallel to a surface of the substrate wherein the microchannel is formed;
   (b) a microfluidic tubing or optical fiber located within the trench and adhered to the sides and bottom of the trench with an adhesive disposed in the trench; and (c) a fluid-tight covering formed over at least a portion of the trench, with the fluid-tight covering comprising a layer of silicon oxynitride.

12. The interconnection of claim 11 wherein the substrate comprises a material selected from the group consisting of semiconductors, crystalline quartz, fused silica, glasses, ceramics, polymers and metals.

13. The interconnection of claim 11 wherein the substrate comprises silicon.

14. The interconnection of claim 11 wherein the trench comprises a pair of sidewalls which are substantially perpendicular to the surface of the substrate.

15. The interconnection of claim 11 wherein the trench comprises a pair of sidewalls which are oriented at oblique angles to the surface of the.substrate.

16. The interconnection of claim 11 wherein the fluid-tight covering further comprises a barrier layer located on at least one side of the silicon oxynitride layer.

17. The interconnection of claim 16 wherein the barrier layer comprises silicon dioxide.

18. The interconnection of claim 11 wherein the trench is graded at an end thereof proximate to the microchannel.

19. A method for forming an interconnection to a microchannel on a substrate, comprising steps for:
   (a) forming an elongate trench below a surface of the substrate near an edge thereof proximate to the microchannel, with the trench being sized to receive one end of a microcapillary tubing or an optical fiber, and with one end of the trench being connected to the microchannel;
   (b) adhering the end of the microcapillary tubing or optical fiber within the trench with an adhesive;
   (c) depositing a sacrificial material within a portion of the trench not occupied by the microcapillary tubing or optical fiber;
   (d) depositing a layer of silicon oxynitride over the surface of the substrate, with the layer of silicon oxynitride forming a fluid-tight covering over the trench and over the end of the microcapillary tubing or optical fiber located within the trench; and
   (e) removing the sacrificial material from the trench.

20. The method of claim 19 wherein the substrate comprises a material selected from the group consisting of semiconductors, crystalline quartz, fused silica, glasses, ceramics, polymers and metals.

21. The method of claim 19 wherein the substrate comprises silicon.

22. The method of claim 19 wherein the step for forming the trench comprises etching the trench.

23. The method of claim 19 wherein the adhesive used for the adhering step comprises an epoxy.

24. The method of claim 23 further wherein the adhering step further includes a step for curing the epoxy using ultraviolet light.

25. The method of claim 19 wherein the sacrificial material comprises a photoresist or a photodefinable polymer.

26. The method of claim 25 wherein the step for removing the sacrificial material from the trench comprises dissolving the photoresist or photodefinable polymer using a solvent.

27. The method of claim 19 further including a step for forming a barrier layer on at least one side of the silicon oxynitride layer.

28. The method of claim 19 wherein the trench is graded at an end thereof proximate to the microchannel.

29. A method for forming a microfluidic device on a substrate, comprising steps for:
   (a) forming a microchannel on the substrate, and forming at least one elongate trench connected to the microchannel, with each trench being located near an edge of the substrate and being sized to receive one end of a microcapillary tubing or optical fiber;
   (b) adhering the end of the microcapillary tubing or optical fiber within the trench with an adhesive;
   (c) depositing a sacrificial material within the microchannel and within a portion of the trench not occupied by the microcapillary tubing or optical fiber;
   (d) depositing a layer of silicon oxynitride over the surface of the substrate, with the layer of silicon oxynitride forming a fluid-tight covering over the microchannel and trench, and over the end of the microcapillary tubing or optical fiber located within the trench; and
   (e) removing the sacrificial material from the microchannel and from the trench.

30. The method of claim 29 wherein the substrate comprises a material selected from the group consisting of semiconductors, crystalline quartz, fused silica, glasses, ceramics, polymers and metals.

31. The method of claim 29 wherein the substrate comprises silicon.

32. The method of claim 29 wherein the step for forming the microchannel and the trench comprises etching the microchannel and the trench.

33. The method of claim 29 wherein the adhesive used for the adhering step comprises an epoxy.

34. The method of claim 33 further wherein the adhering step further includes a step for curing the epoxy using ultraviolet light.

35. The method of claim 29 wherein the sacrificial material comprises a photoresist or a photodefinable polymer.

36. The method of claim 35 wherein the step for removing the sacrificial material from the trench comprises dissolving the photoresist or photodefinable polymer using a solvent.

37. The method of claim 29 further including a step for forming a barrier layer on at least one side of the silicon oxynitride layer.

38. The method of claim 29 wherein the trench is graded at an end thereof proximate to the microchannel.

* * * * *